United States Patent [19]

Taillebois

[11] Patent Number: 4,622,461
[45] Date of Patent: Nov. 11, 1986

[54] DEVICE FOR OPTICAL CODE READING, BY DIASCOPY, AND A PROCESS FOR MANUFACTURING SAME

[75] Inventor: Jacques A. J. Taillebois, Plaisir, France

[73] Assignee: M.C.B., Courbevoie Cedex, France

[21] Appl. No.: 600,452

[22] Filed: Apr. 16, 1984

[30] Foreign Application Priority Data

Apr. 20, 1983 [FR] France ................................ 83 06482

[51] Int. Cl.$^4$ ............................................. G01D 5/34
[52] U.S. Cl. ................................ 250/231 SE; 250/239
[58] Field of Search ............. 250/231 SE, 237 G, 239, 250/551; 340/347 P; 356/395

[56] References Cited

U.S. PATENT DOCUMENTS 4,375,592 3/1983 Cox et al. .................... 250/231 SE 4,475,034 10/1984 Maddox et al. ............. 250/231 SE

FOREIGN PATENT DOCUMENTS 2915027 10/1980 Fed. Rep. of Germany .
381127 10/1964 Switzerland .

Primary Examiner—Eugene R. LaRoche
Assistant Examiner—Steven J. Mottola
Attorney, Agent, or Firm—Cushman, Darby & Cushman

[57] ABSTRACT

The device comprises a metal chassis (2a) bent into a U shape and cut out with a light support (17), a support for an integrated circuit chip (27) and an indented lateral wing (22, 23, 24); the light source is shown at (34). The chassis (2a) with the light source and the chip in position is fixed by means of the holes (21, 21a, 20, 20a) to the fixed part (37), when the graduated disk (39) integral with the rotary shaft (38) is in position between the source (34) and the chip (27).

12 Claims, 5 Drawing Figures

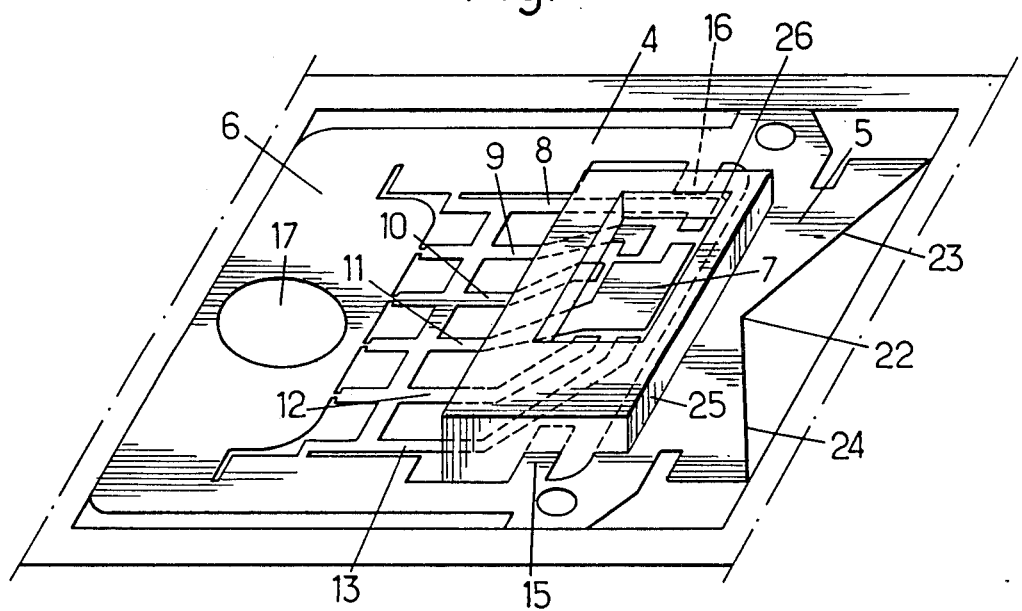
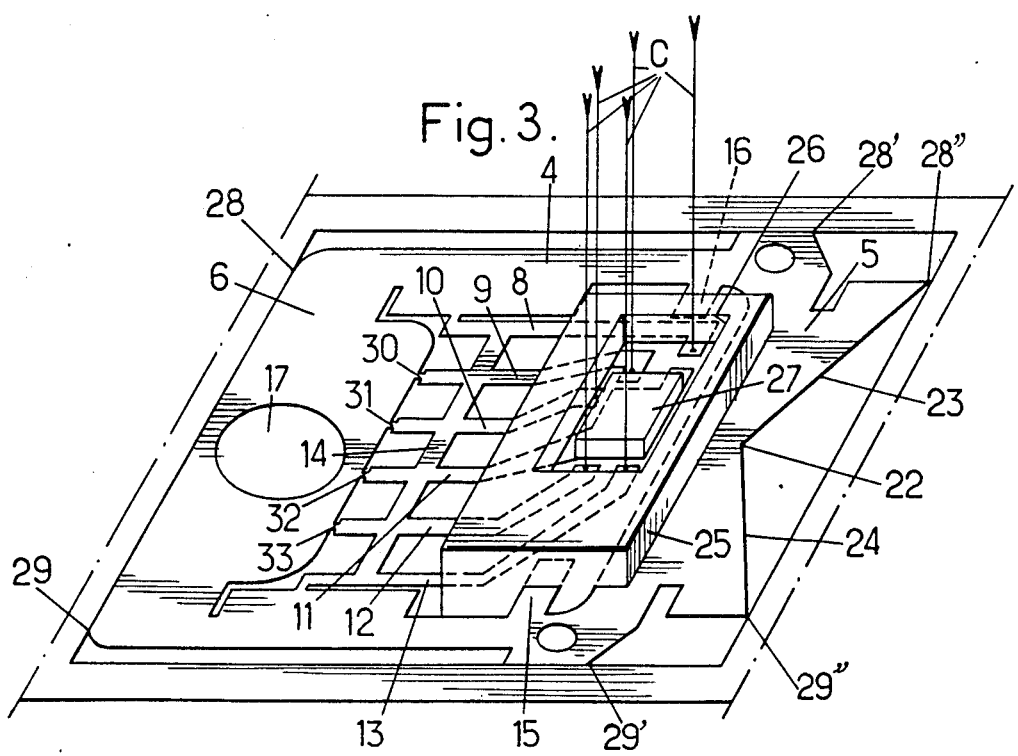

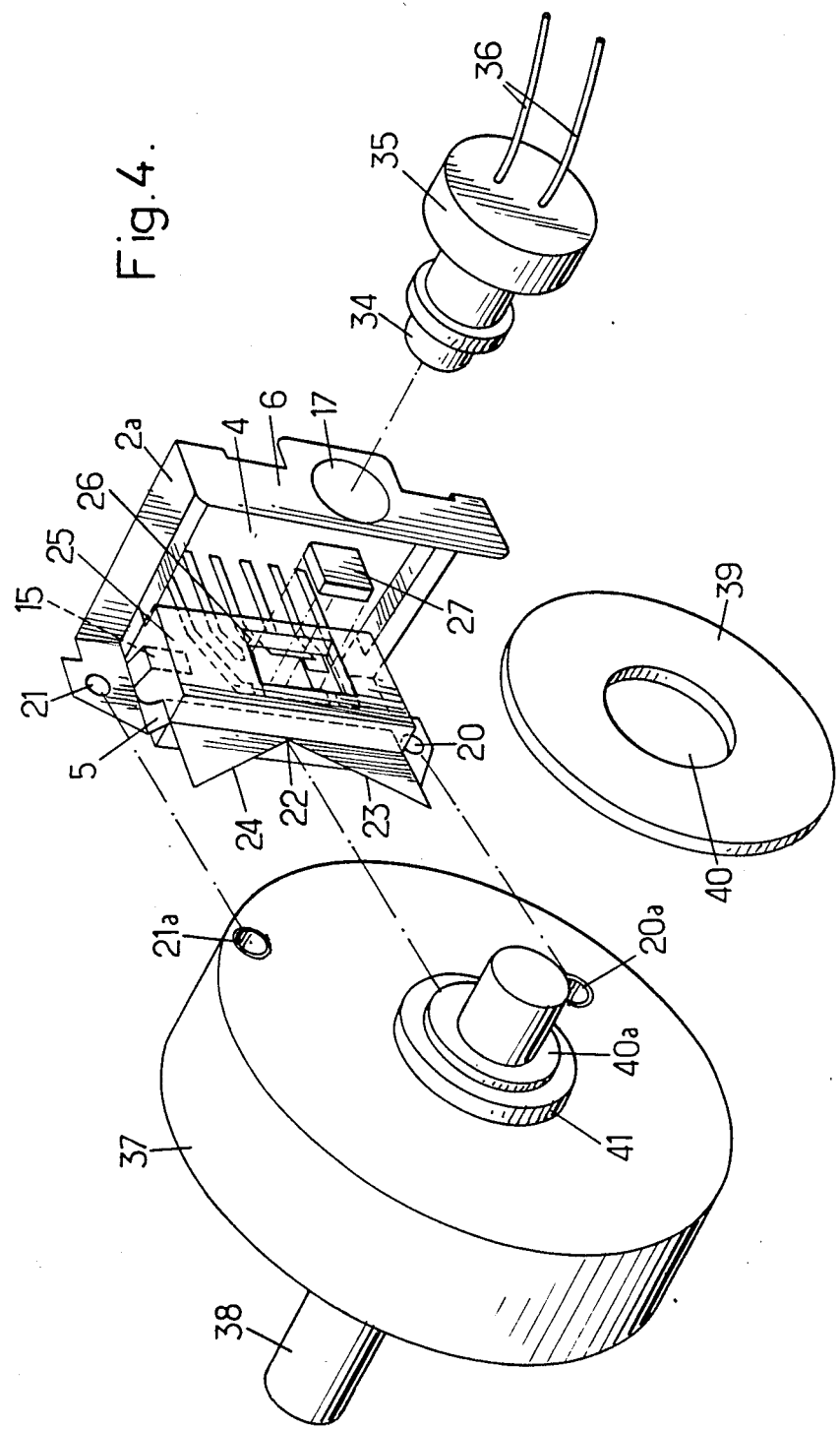

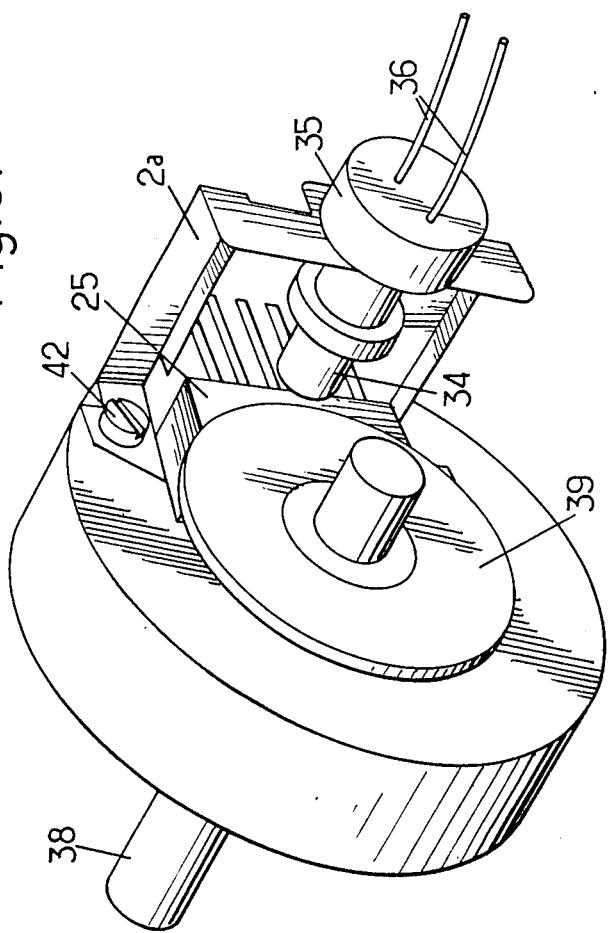

DEVICE FOR OPTICAL CODE READING, BY DIASCOPY, AND A PROCESS FOR MANUFACTURING SAME

The present invention relates to devices for reading, by diascopy, an optical code carried by a disk or a transparent strip.

It is known that such a device comprises—in combination with a disk or strip comprising a succession of opaque zones and fine alternating transparent zones—a light source, a reticle or reading index, and a photo detector which detects if it is an opaque zone or a transparent zone which is in front of the reticle or the index, the source-reticle (or index) - photo detector assembly, on the one hand, and the disk or the strip on the other being moveable with respect to each other, either by rotation (case of the disk), or by translation (case of the strip).

Devices for reading an optical code by diascopy are described for example in U.S. Pat. Nos. 3,187,187 (Wingate), 4,182,953 (Hurley and Krystek) and 4,338,517 (Perrine).

Generally the disk or the strip is supported by a mechanical part whose angular position (case of the disk) or linear position (case of the strip) may be located whereas, in the reader properly speaking, the light source, the index (or the reticle) and the photo detector are perfectly aligned so as to define a specific optical path: the light emitted by the light source strikes the disk or strip shaped support in alternately opaque and transparent zones, while passing therethrough only if a transparent zone is opposite the index or reticle, which is generally formed by a narrow slit having advantageously the width of the transparent zones, and then striking the photo detector which emits an electric signal in response to the passage of each transparent zone in front of the index or reticle; this signal is amplified and shaped in an electronic unit associated with the photo detectors, before being counted or recorded for example.

When several reading tracks are provided on the disk or the strip, the reading device generally comprises as many source-index (or reticle)—photo detector (with associated electronic unit) assemblies as tracks, for example 10 such assemblies for a 10 bit coder.

The aim of the present invention is to provide a reading device or optical reader of this type which is both very accurate and inexpensive.

The further aim is to provide such an optical reader by means of an automatic process which, while allowing large scale production, is both accurate and simple and adapted to produce accurate and inexpensive readers.

An optical reading device in accordance with the invention comprises in combination:
- a metal chassis bent in the shape of a U and cut out, having on the one hand a light source support mounted on one of the two sides of the U-shaped chassis and, on the other hand, a support for an integrated circuit chip and an indented lateral flange carried by the other side of the U-shaped chassis, as well as connections for connecting the integrated circuit and fixing lugs;
- a light source adapted to supply a beam of parallel rays disposed in said light source support; and
- an integrated circuit chip comprising at least one photo detector with, preferably, its associated amplification and shaping circuits; said reading device being adapted to be fixed, by means of said fixing lugs, to a mechanical member with an element carrying at least one optically coded track, said indented lateral flange ensuring the correct optical superimposition of the reading device with said at least one optically coded track.

The invention also relates to the reading device-mechanical member assembly thus obtained.

The process for manufacturing such an optical reading device comprises the following phases:
- from a metal strip a series of chassis are cut out formed by successive grids, each comprising a support for an integrated circuit chip, a light source support and an indented lateral flange;
- on such a grid is deposited a block of material comprising a recess for receiving an integrated circuit chip, this block with its recess forming said support for such a chip;
- an integrated circuit chip is placed in said recess;
- said chassis supporting said block with said chip in its recess is bent into a U-shape, the two supports being carried by one of the sides of the U ; and
- a parallel light source is inserted into said support.

Advantageously, the grids are cut out from the metal strip in a series of successive operations at several work stations disposed side by side, the strip passing in front of these stations and being advanced step by step.

For correct positioning of the different elements on the grid, this latter may comprise centering holes and/or the indentation of said flange has the shape of a V whose opening forms preferably an obtuse angle.

The block is advantageously made from a resin, such as an epoxy resin, or from ceramics.

To form a complete optical reading device-mechanical member assembly with coded track support, assembling is then carried out by using the indented lateral flange of the reading device thus formed with said member, by means of fixing lugs provided on said grid.

The invention will, in any case, be well understood from the complement of description which follows, as well as the accompanying drawings, which complement and drawings are of course given especially by way of indication.

FIGS. 2 and 3 illustrate respectively the second phase (positioning of the block of material) and the third phase (positioning of the integrated circuit chip) of this process;

Figure 1:
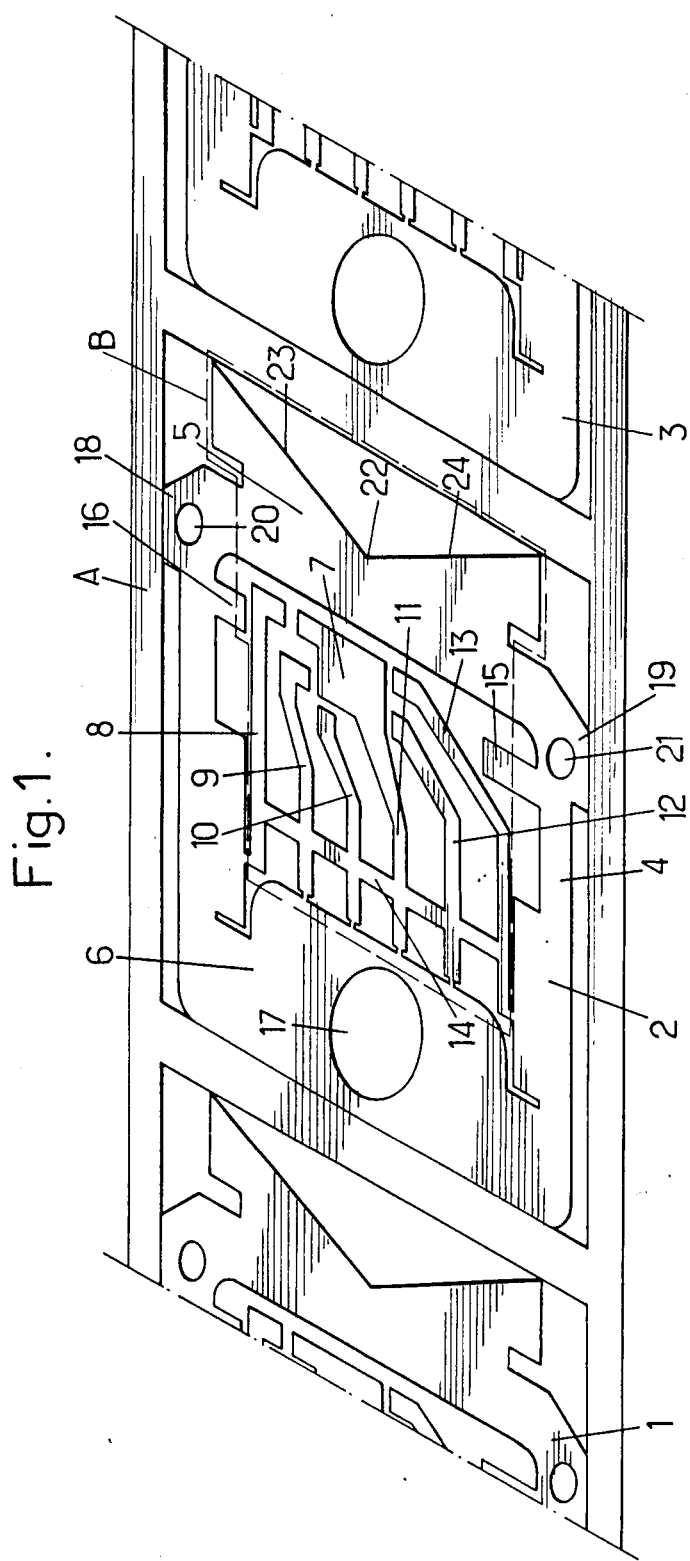
FIG. 1 illustrates the first operating phase in the process for manufacturing the optical reader according to the invention, namely the cutting out of a succession of chassis or grids from a metal strip.

FIG. 4 illustrates, in an isometric projection, the following phases of the process (bending of the chassis and positioning of the light source) and mounting of the optical reader on the mechanical member with positioning of an optically coded disk; and FIG. 5, finally, illustrates, in isometric projection, an optical reader in accordance with the invention positioned on a mechanical member rotating with an optically coded disk.

The formation of an accurate and inexpensive diascopy reading device by using the process of the invention will now be described.

A metal strip or ribbon A is required, more especially a steel strip. This is cut out in the flat state, as shown in FIG. 1, by carrying out a succession of operations at a series of work stations in front of which passes strip 1 which is advanced step by step by means now shown. Thus a series of flat chassis 1, 2, 3 is obtained. Each chassis after cutting out, forms a grid which will then (as explained hereafter) be bent as shown in FIG. 4 (bent chassis 2a).

The chassis (illustrated in the flat condition in FIG. 1 and in the bent condition in FIG. 4) comprises essentially three parts, 4, 5 and 6, namely a central part 4 and two lateral parts 5 and 6.

The central part 4 comprises a support plane 7 for the integrated circuit chip and connections 8, 9, 10, 11 and 12 and 13 for the integrated circuit of said chip, a band 14 initially retaining the connections 8 to 13 in position; this central part 4 also comprises two strengthening lugs 15 and 16 for engaging the block of plastic material which will be mentioned hereafter.

The lateral part 6 forms the support for the light source and for this it has an orifice 17 for receiving this light source.

As for the lateral part 5, it comprises fixing lugs 18 and 19 pierced respectively with centering holes 20 and 21 and a centering V 22 with its two rectilinear bearing edges 23 and 24 forming an obtuse angle.

Then part B (surrounded by a broken line in FIG. 1) is slightly raised with respect to the plane of FIG. 1.

After the operation of cutting out the grid 2 (as shown in FIG. 1) and the raising of part B thereof, which operations form the first phase of the process of the invention, we pass to the second phase illustrated in FIG. 2. This second phase consists in providing a block 25 of plastic material (for example an epoxy resin) or made from ceramics, disposed on each side of part B and in which the strengthening lugs 15 and 16 will be embodied after bending (fourth phase of the operation). This block 25 comprises a rectangular recess 26 for receiving an integrated circuit chip having a dimension less than the dimension of recess 26. The correct positioning of lug 25 is achieved with a molding tool positioned by means of centering holes 20 and 21.

The third operating phase (FIG. 3) consists in disposing the integrated circuit chip 27 in recess 26, then this chip is soldered to connections 8 to 13, at the locations indicated by arrows C. Positioning of chip 27 in recess 26, in the correct position on the plane of support 27, is achieved for example within 5 μm by means of a machine taking reference on the centering V 22 and its edges 23 and 24.

After checking the operation of the integrated circuit of the chip, a window made for example from welded or bonded glass (not shown) is disposed on the block of plastic material 25, so as to close recess 26 while protecting the integrated circuit chip more especially against dust and humidity. The window may be replaced by a deposit of resin or transparent varnish.

Then the attachment points 28, 28', 28", 29, 29', 29" on the one hand and 30, 31, 32 and 33 on the other are cut, then the lateral zones of the grid are bent at right angles with respect to the central zone thereof. This is the fourth phase of the process of the invention, and thus the bent chassis 2a shown in FIG. 4 is obtained (in this Figure the integrated circuit chip 27 has been shown, for the sake of clarity, outside the recess 26 of block 25).

Once the chassis has thus been bent, with the strengthening lug 16 and 17 in position in block 25, the head 34 of the light source 35 is housed in orifice 17, a collar (not visible in FIG. 4) of the light source 35 bearing on the part 6 which serves as heat sink for cooling the light source. The head 34 of the light source comprises an optical system which emits a parallel light beam directed on chip 27 (in position in the recess 26), facing this light source. This source is supplied with power by conductors 36.

FIG. 4 also illustrates the mounting of the reading device which has just been formed in this way on a coder body formed by a fixed part 37 for receiving this reading device and a rotating shaft 38, on which is mounted a coded disk 39 pierced with a hole 40 into which fits a cylindrical collar 40a applied against a circular base integral with the fixed part 37 and providing centering of the coded disk 39. The coded disk 39 rotates at a certain distance from part 37 so as to allow the positioning, between this part 37 and disk 39, of block 25 with chip 27.

Disk 39 may be formed for example, in a known way, from glass and may comprise a deposit formed by a thin microetched layer.

The positioning of the reading device, with light source 35 and integrated circuit chip 27, on the fixed part 37 is achieved by means of bolts 42 (FIG. 5) passing through the holes 20 and 21 of the reading device and the corresponding holes 20a and 21a in part 37.

Thus the reading device-rotary shaft 38 with coded disk 39 assembly, shown in FIG. 5, is obtained.

With the reading device of the invention, the information provided on the coded disk 39 and formed by a succession of transparent zones and opaque zones can be read, the parallel light from source 35 passing through the transparent zones of disk 35 so as to strike the integrated circuit chip 27.

The integrated circuit chip may comprise a series of rectangular photo detectors of very small dimensions, for example 100 by 50 μm, which allows several tracks on disk 39, the reading device only comprising one light source and a single chip, instead of several unit devices as in the prior art, as was mentioned in the preamble.

Thus a very accurate and very inexpensive optical code reading device is obtained by means of a manufacturing process which may be automated for large scale production.

The reading device is robust, it can be readily adapted to any diameter of coded disk and can be accurately and rapidly positioned with respect to the coded device, the integrated circuit chip (not visible in FIG. 5) being situated behind the coded disk in the block of plastic material 25.

The centering holes 20 and 21 and the centering V 22, with its edges 23 and 24, allow very accurate positioning of the different elements of the reading device, on the one hand, and positioning of this device with respect to the coded disk, on the other, the edges 23 and 24 of the V coming to bear tangentially against the circular base 41.

As is evident and as it follows moreover from what has gone before, the invention is in no way limited to those of its modes of application and embodiments which have been more especially considered; it embraces, on the contrary, all variations thereof.

I claim:

1. a device for reading an optical code by diascopy comprising in combination:

a metal chassis bent into a U-shape and having (a) a light source support carried by one of two sides of the U-shaped chassis, and (b) a support for a photosensitive integrated circuit chip, (c) an indented lateral wing carried by the other side of the U shaped chassis, (d) connections for connecting an integrated circuit to said chip support, and (e) mounting lugs;

a light source disposed in said light source support and adapted to supply a beam of light;

a photosensitive integrated circuit chip having at least one photo-detector with its associated amplification and shaping circuits , said reading device being adapted to be mounted by means of said mounting lugs to a mechanical member having an optically coded track, said indented lateral wing ensuring correct optical superimposition of the reading device with said optically coded track.

2. The device according to claim 1 wherein said integrated circuit chip includes a plurality of photo-detectors with their associated amplification and shaping circuits.

3. The device according to claim 1, wherein said indented lateral flange is formed with a centering V having two rectilinear edges forming an obtuse angle.

4. The device according to claim 1, wherein said chassis includes at least two centering holes.

5. The reading device according to claim 1, wherein the metal chassis supports a block of material having a recess in which the integrated circuit chip is housed.

6. The device according to claim 5, wherein said block is includes plastic material .

7. An assembly for reading an optical code by diascopy comprising in combination:
a metal chassis bent into a U-shape and having (a) a light source support carried by one of two sides of the U-shaped chassis, (b) a support for photosensitive integrated circuit chip, (c) an indented lateral wing carried by the other side of the U shaped chassis, (d) connections for connecting the integrated circuit to the chip support, and (e) mounting lugs;

a light source disposed in said light source support and adapted to supply a beam of light;

a photosensitive integrated circuit chip having at least one photo-detector with its associated amplification and shaping circuits , said reading assembly being adapted to be mounted, by means of said mounting lugs, to a mechanical member having an optically coded track, said indented lateral wing ensuring correct optical superimposition of the reading device with said optically coded track; and a mechanical member having at least one optically coded track.

8. An assembly according to claim 7, wherein said mechanical member includes a disk positioned so that said integrated circuit chip and said light source are on opposite sides of said disk.

9. A process for manufacturing an optical reading device comprising the following steps:
cutting out, from a metal strip, a series of chassis, each chassis comprising a support for a photosensitive integrated circuit chip, a light source support and an indented lateral wing;

depositing on each one of said chassis a block of material having a recess adapted to receive an integrated circuit chip, this block with its recess forming a housing for said chip;

placing a photosensitive integrated circuit chip in said recess;

bending said chassis into a U-shape, the integrated circuit chip support and the light source support each being respectively carried on one of the respective sides of the U-shape; and fitting a light source into said light source support.

10. The process according to claim 9, wherein said chassis are cut out from a metal strip in a series of successive operations at several work stations disposed side by side, the strip passing in front of these stations while being advanced step by step.

11. A process for forming an assembly for reading an optical code by diascopy comprising the following steps:
cutting out from a metal strip, a series of chassis, each chassis comprising a support for an integrated circuit chip, a light source support and an indented lateral wing;

depositing on each chassis a block of material having a recess adapted to receive an integrated circuit chip, said block with its recess forming a housing for such a chip;

placing a photosensitive integrated circuit chip in said recess;

bending said cahssis into a U-shape, the integrated circuit chip support and the light source support each being respectively carried on one of the respective sides of the U-shape;

fitting a light source into said support; and mounting said reading device on a mechanical member having a coded track carrying element, by means of mounting lugs provided on said chassis.

12. A device according to claim 5, wherein said block includes ceramic material.

* * * * *